(12) United States Patent
Patel

(10) Patent No.: US 11,765,836 B2
(45) Date of Patent: Sep. 19, 2023

(54) INTEGRATED CIRCUIT DEVICE WITH EDGE BOND DAM

(71) Applicant: XILINX, INC., San Jose, CA (US)

(72) Inventor: Bhavesh Patel, Fremont, CA (US)

(73) Assignee: XILINX, INC., San Jose, CA (US)

( * ) Notice: Subject to any disclaimer, the term of this patent is extended or adjusted under 35 U.S.C. 154(b) by 51 days.

(21) Appl. No.: 17/586,212

(22) Filed: Jan. 27, 2022

(65) Prior Publication Data
US 2023/0240020 A1    Jul. 27, 2023

(51) Int. Cl.
| H05K 1/02 | (2006.01) |
| H05K 3/34 | (2006.01) |
| H05K 1/11 | (2006.01) |

(52) U.S. Cl.
CPC .......... H05K 3/3436 (2013.01); H05K 1/024 (2013.01); H05K 1/115 (2013.01); *H05K 2201/0183* (2013.01); *H05K 2201/10734* (2013.01)

(58) Field of Classification Search
CPC ............. H05K 3/3436; H05K 1/024; H05K 2201/0183; H05K 2201/10734
See application file for complete search history.

(56) References Cited

U.S. PATENT DOCUMENTS

| 6,114,763 | A | 9/2000 | Smith |
| 6,194,778 | B1 * | 2/2001 | Ohsawa ................. H01L 23/24 |
| | | | 257/668 |
| 6,656,773 | B2 | 12/2003 | Boyaud et al. |
| 6,940,182 | B2 | 9/2005 | Hilton et al. |
| 7,148,560 | B2 * | 12/2006 | Lee ........................ H01L 21/563 |
| | | | 257/667 |
| 7,883,937 | B1 | 2/2011 | Kang et al. |
| 8,476,115 | B2 | 7/2013 | Choi et al. |
| 9,368,422 | B2 | 6/2016 | Zhang et al. |
| 9,627,329 | B1 | 4/2017 | Kwon et al. |
| 10,438,863 | B1 | 10/2019 | Boja et al. |
| 2006/0051889 | A1 | 3/2006 | Yamunan |
| 2006/0087033 | A1 | 4/2006 | Goh et al. |
| 2008/0157329 | A1 | 7/2008 | Inoue |
| 2010/0244024 | A1 | 9/2010 | Do et al. |
| 2011/0084384 | A1 | 4/2011 | Sakata et al. |
| 2011/0260338 | A1 * | 10/2011 | Lee ......................... H01L 21/50 |
| | | | 257/E21.511 |
| 2012/0068353 | A1 * | 3/2012 | Huang ............... H01L 23/49816 |
| | | | 257/774 |
| 2012/0080787 | A1 | 4/2012 | Shah et al. |
| 2012/0091579 | A1 | 4/2012 | Park et al. |
| 2012/0098123 | A1 | 4/2012 | Yu et al. |
| 2012/0159118 | A1 | 6/2012 | Wong et al. |
| 2012/0187583 | A1 | 7/2012 | Karpur et al. |
| 2012/0193779 | A1 | 8/2012 | Lee et al. |
| 2012/0211885 | A1 | 8/2012 | Choi et al. |
| 2013/0228908 | A1 | 9/2013 | Takahashi |

OTHER PUBLICATIONS

Zhang et al., "Recent Advances in Flip-Chip Underfill: Materials, Process, and Reliablity", Aug. 2004, pp. 515-524, vol. 27, No. 3 IEEE Transactions on Advanced Packaging.

\* cited by examiner

*Primary Examiner* — Sherman Ng
(74) *Attorney, Agent, or Firm* — Patterson + Sheridan, LLP

(57) ABSTRACT

An electronic device and methods for fabricating the same are disclosed herein that utilize a dam formed on a printed circuit board (PCB) that is positioned to substantially prevent edge bond material, utilized to secure a chip package to the PCB, from interfacing with the solder balls transmitting signals between the PCB and chip package.

19 Claims, 3 Drawing Sheets

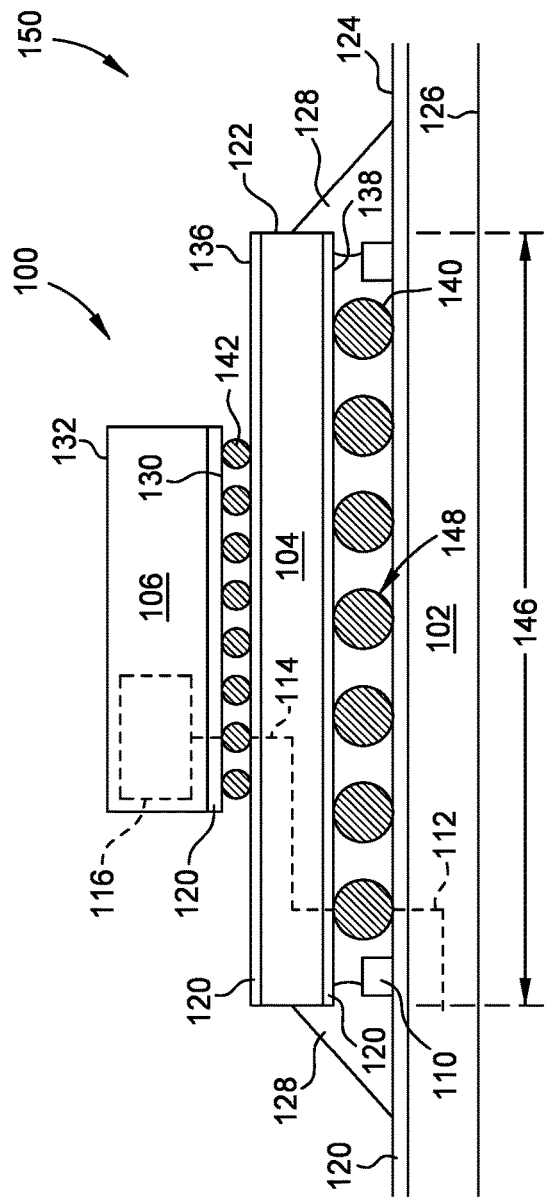
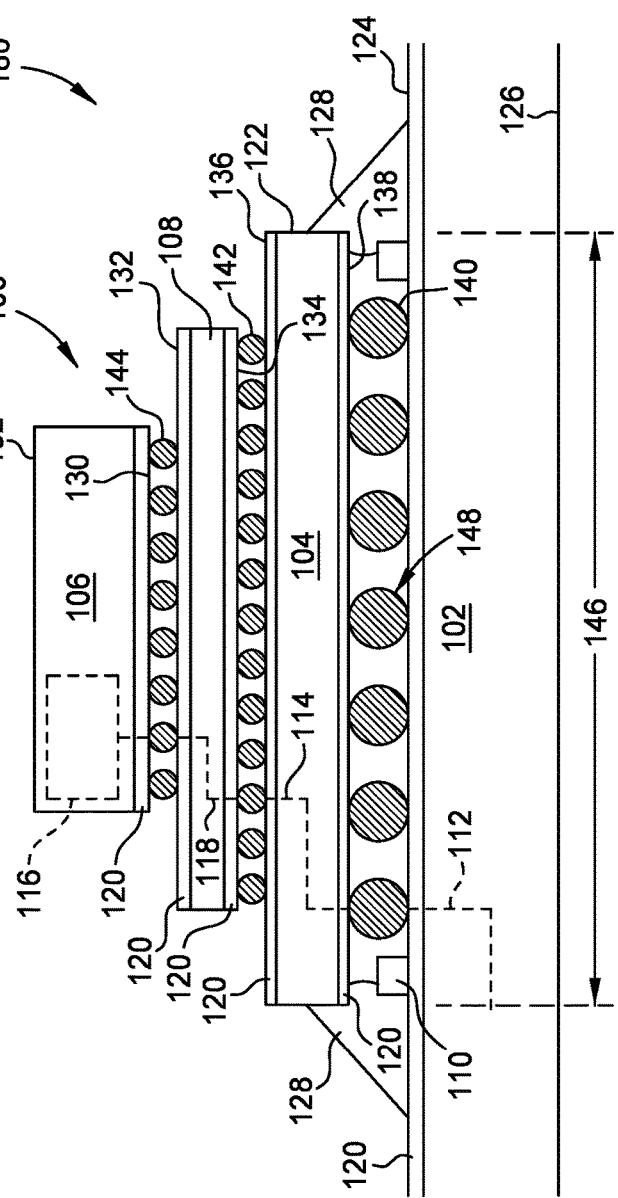
FIG. 1A
FIG. 1B

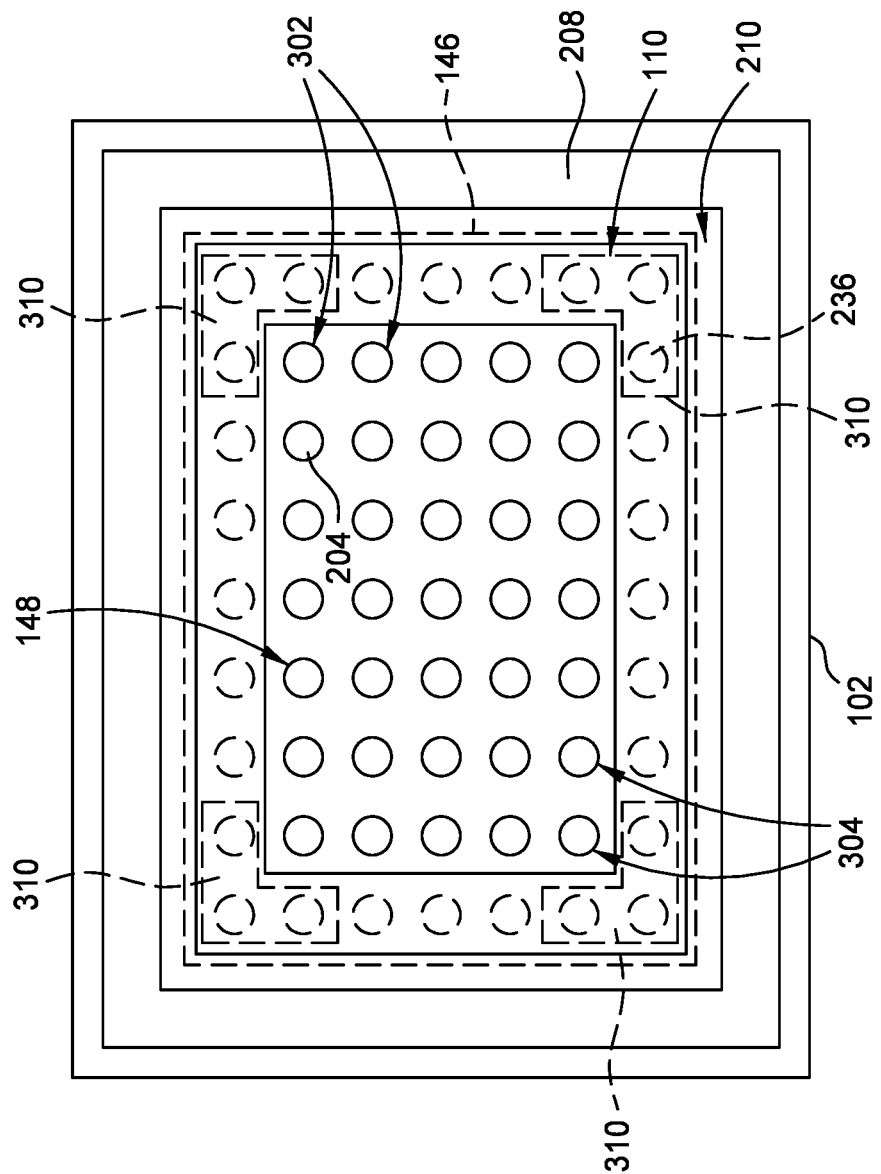

INTEGRATED CIRCUIT DEVICE WITH EDGE BOND DAM

TECHNICAL FIELD

Embodiments of the present invention generally relate to integrated circuit devices configured to mitigate edge bond material from contacting solder balls utilized to carry high speed signals between chip packages and a printed circuit board.

BACKGROUND

Electronic devices, such as tablets, computers, copiers, digital cameras, smart phones, control systems, automated teller machines, data centers, artificial intelligence system, and machine learning systems among others, often employ electronic components which leverage chip packages for increased functionality and higher component density. Conventional chip packaging schemes often utilize a package substrate, often in conjunction with a through-silicon-via (TSV) interposer substrate, to enable a plurality of integrated circuit (IC) dies to be mounted to a single package substrate. The IC dies may include memory, logic or other IC devices. The chip packages are typically coupled to a printed circuit board using a ball grid array (BGA).

The BGA is formed from an array of solder balls located on a bottom external surface of a package substrate. The solder balls are reflowed to attach the package both electrically and mechanically to contact pads formed on the top surface of the PCB.

Recently, the use of edge bond material to secure chip packages to the PCB has become more commonly used to meet stringent reliability requirements. However, the edge bond material often flows between the chip package and PCB, allowing the edge bond material to contact the first one row of solder connections. When contacting the solder connections utilized to carry data signals, the edge bond material creates an imbalance in the impedance characteristics the positive and negative legs of differential data signal pairs. Return loss degradation may be as much as 3-5 dB at 28 Ghz resulting in electrical channel performance loss.

Therefore, a need exists for an improved interface between a chip package and a PCB that mitigates the propensity of edge bond material to contact signal interconnects.

SUMMARY

An electronic device and methods for fabricating the same are disclosed herein. The disclosed electronic device and methods utilize a dam formed on a printed circuit board (PCB) that is positioned to substantially prevent edge bond material, utilized to secure a chip package to the PCB, from interfacing with the solder balls transmitting signals between the PCB and chip package.

In one example, an electronic device is provided that includes a printed circuit board having a first surface. The first surface has a landing region configured to be covered by a chip package when the chip package is mounted to the first surface. A plurality of contact pads are formed on the landing region of the PCB and are arranged to receive a ball grid array (BGA) formed on the chip package. A dam is disposed on the first surface of the PCB. At least a portion of the dam is disposed within the landing region and substantially surrounds the plurality of contact pads.

In another example, an electronic device is provided that includes a chip package mounted to a printed circuit board (PCB). A ball grid array (BGA) is mechanically and electrically connected to contact pads formed on a first surface of the PCB. A dam is disposed between the PCB and the chip package. The dam bounds a first row of contact pads of the plurality of contact pads. The first row of contact pads is coupled to a first row of solder connections of the BGA disposed closest to an edge of the chip package. Edge bond material is disposed on the first surface of the PCB. The edge bond material contacts an edge of the chip package, the first surface of the PCB and the dam.

In another example, an electronic device is provided that includes a chip package mounted to a printed circuit board (PCB). A plurality of electrical connections mechanically and electrically couple the chip package to a first surface of the PCB. One or more dams are disposed between the PCB below the chip package. The one or more dams are disposed outward of the electrical connections. The one or more dams are spaced from one of the chip package or PCB. Edge bond material is disposed on the first surface of the PCB. The edge bond material contacts an edge of the chip package, the first surface of the PCB and the one or more dams.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A and 1B are schematic front views of electronic devices having a chip package disposed on a printed circuit board (PCB) having a dam for controlling the underflow of edge bond material between the chip package and PCB.

FIG. 3 is a top view of the PCB of FIG. 1A illustrating the spatial relationship between contact pads for receiving the chip package and the dam.

To facilitate understanding, identical reference numerals have been used, where possible, to designate identical elements that are common to the figures. It is contemplated that elements of one embodiment may be beneficially incorporated in other embodiments.

DETAILED DESCRIPTION

Figure 2:
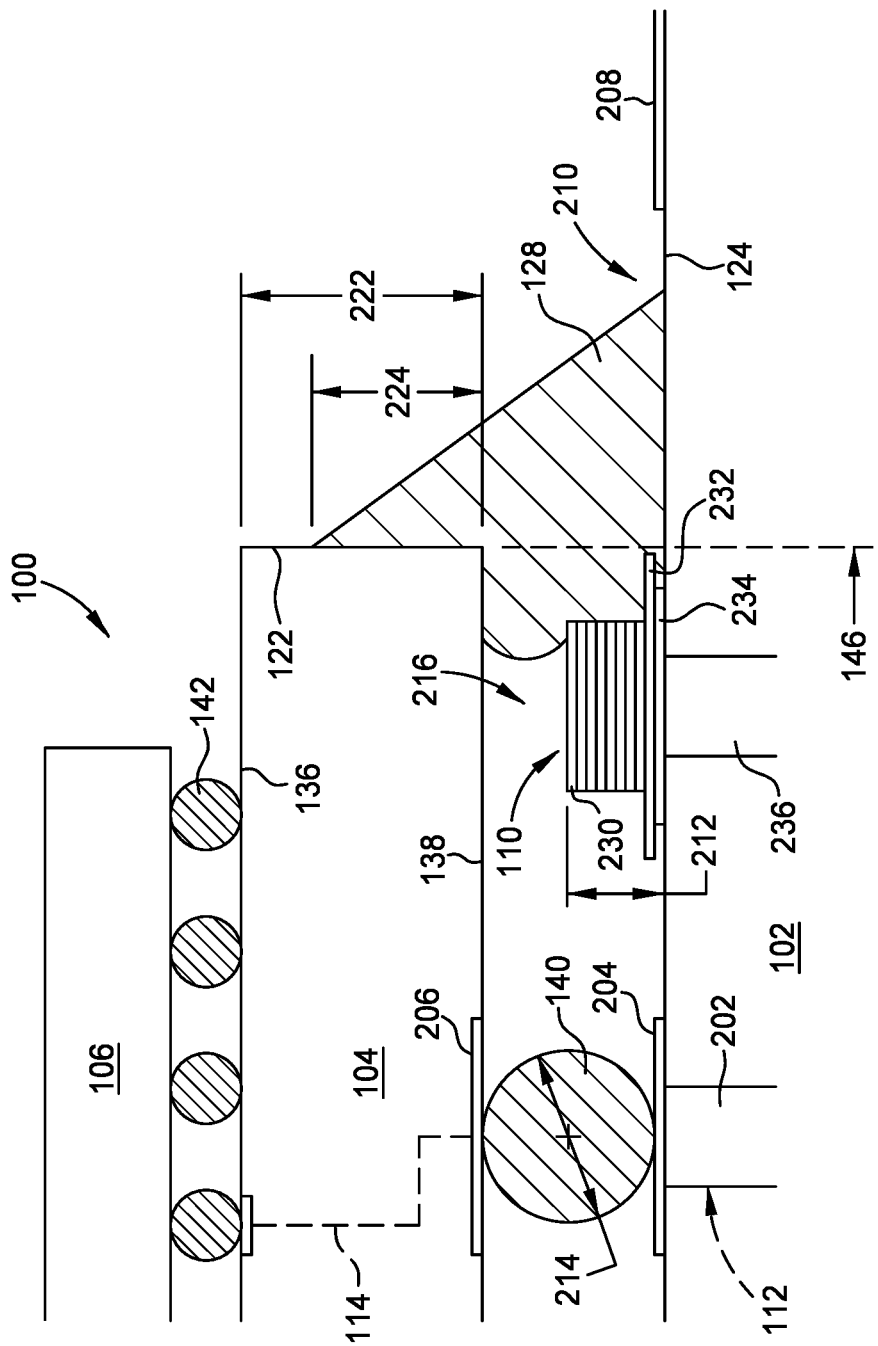
FIG. 2 is a partial sectional view of one example of the electronic device more clearly illustrating the position of the dam.

An electronic device and methods for fabricating the same are disclosed herein. The disclosed electronic device and methods utilize a dam to control the flow edge bond material, utilized to secure a chip package to a printed circuit board (PCB), from penetrating freely between the PCB and the chip package to the area where signal transmission is made between the PCB and the chip package. Although shown formed on the PCB, the dam may also be completely or partially formed on a bottom surface of the chip package. By confining the flow of edge bond material using the dam to the edge region of the chip package, the edge bond material is substantially prevented from interfacing with the solder balls transmitting signals between the PCB and the chip package. Thus, the dam effectively reduces the potential for contact of the edge bond material with the signal transmission solder balls, resulting in robust, reliable and repeatable signal transmission speed and performance of the electronic device.

Turning now to FIG. 1A, FIG. 1A is a schematic sectional view of an electronic device 150 having a chip package 100 disposed on a printed circuit board (PCB) 102. The electronic device 150 includes a dam 110 used to control the flow of edge bond material 128. As further described below with reference to FIG. 2, the dam 110 confines the edge bond material 128 to a region predominantly outward of the chip package 100 and away from the signal interconnects formed between the PCB 102 and the chip package 100.

Continuing to refer to FIG. 1A, the chip package 100 includes at least one or more integrated circuit (IC) die 106 mounted to a package substrate 104. The IC die 106 includes functional circuitry 116 that may include block random access memory (BRAM), UltraRAM (U RAM), digital signal processing (DSP) blocks, configurable logic elements (CLEs), and the like. The IC die 106 may be, but is not limited to, programmable logic devices, such as field programmable gate arrays (FPGA), memory devices, such as high band-width memory (HBM), optical devices, processors or other IC logic structures. The IC die 106 may optionally include optical devices such as photo-detectors, lasers, optical sources, and the like. In the example of FIG. 1A, the IC die 106 is a logic die having math processor (also known as math engine) circuitry for accelerating machine-learning math operations in hardware, such as self-driving cars, artificial intelligence and data-center neural-network applications.

In another example, the one or more IC dies 106 includes a plurality of IC dies 106. The IC dies 106 may be disposed in a vertical stack and/or disposed laterally side by side. It is contemplated that the IC dies 106 comprising the plurality of IC dies 106 may be the same or different types, including types other than FPGA dies. Although only one IC die 106 is shown in FIG. 1A, the number of IC dies 106 disposed in the chip package 100 may vary from one to as many as can fit within the chip package 100.

The IC die 106 includes a die body having a bottom surface 130 and a top surface 132. The bottom surface 130 of the IC die 106 is mechanically and electrically connected to a top surface 136 of the package substrate 104 by solder interconnects 142. The solder interconnects 142 electrically connects the functional circuitry 116 of the IC die 106 to the package circuitry 114 formed through the package substrate 104. The package circuitry 114 is electrically connected to the circuitry 112 of the PCB 102 by solder balls 140. The solder balls 140 mechanically and electrically connect a top surface 124 of the PCB 102 to a bottom surface 138 of the package substrate 104. The PCB 102 also includes a bottom surface 126 that is opposite the top surface 124. In one example, the solder balls 140 are arranged in a ball grid array (BGA) 148.

The top surface 136 and the bottom surface 126 of the package substrate 104 are coupled by an edge 122 that defines the outer perimeter of the package substrate 104. The edge 122 of the package substrate 104 generally is also the outer perimeter of the chip package 100. Thus, when chip package 100 is mounted to the PCB 102, the package substrate 104 covers a landing region 146 of the top surface 124 of the PCB 102. The landing region 146 of the top surface 124 of the PCB 102 includes contact pads (204) for receiving the solder balls 140 of the BGA 148 of the chip package 100, as later shown in FIG. 2.

Optionally, an interposer 108 may reside between the package substrate 104 and IC die 106 as shown in an electronic device 180 illustrated in FIG. 1B. The electronic device 180 is generally the same as the electronic device 150 described above, except for the inclusion of the interposer 108.

The interposer 108 includes a bottom surface 134 facing the top surface 136 of the package substrate 104 and a top surface 132 facing the bottom surface 130 of the IC die 106. Interposer circuitry 118 is formed through the interposer 108. The interposer circuitry 118 is coupled to the functional circuitry 116 of the IC die 106 by solder interconnects 144, and to the package circuitry 114 of the package substrate 104 by solder interconnects 142.

In both of the electronic devices 150, 180 illustrated in FIGS. 1A and 1B, interconnect regions 120 facilitate the electrical routing at the interfaces defined between the IC die 106, interposer 108, package substrate 104 and PCB 102. When in the IC die 106, the interconnect region 120 generally includes the top metal layers and contact pads of the BOEL layers of the IC die 106. Optionally, the interconnect region 120 may include or alternatively be a redistribution layer residing directly below the IC die 106. The redistribution layer electrically and mechanically connects the IC die 106 with neighboring interposer 108 or package substrate 104. The redistribution layer includes a plurality of lines and vias, separated by dielectric layers, in which an interconnect metalization is formed. In the interposer 108 and package substrate 104, the interconnect regions 120 may be formed on the top and/or bottom surfaces. 132, 142, 136, 138. Interconnect regions 120 of the interposer 108 and/or package substrate 104 generally include built-up layers in which interconnect routing is formed from metal layers and vias, terminating at contact pads. In the PCB 102, the interconnect region 120 generally includes contact pads connected by traces to vias. The interconnect region 120 of the PCB 102 may also include additional metal layers, vias, and traces.

As first introduced above, the dam 110 is formed on the top surface 124 of the PCB 102 and is used to confine the edge bond material 128 to the region predominantly outward of the edge 122 of the package substrate 104 and out of a portion of the landing region 146 defined inward of the dam 110 below the chip package 100. The edge bond material 128 is generally an epoxy or other suitable adhesive. The edge bond material 128 may be heat-cured or UV-cured, and may also be a thixotropic material that reduces the propensity of the edge bond material 128 to wick between the package substrate 104 and the PCB 102. In the example depicted in FIGS. 1A and 1B, edge bond material 128 is utilized without additional underfill disposed in the portion of the landing region 146 defined inward of the dam 110.

FIG. 2 is a partial sectional view of one example of the electronic device 150 more clearly illustrating the position of the dam 110. In FIG. 2, the dam 110 is illustrated completely within the landing region 146, that is, inward of the edge 122 of the package substrate 104/chip package 100. However, an outward edge of the dam 110 may alternatively be aligned or even outward of the edge 122 of the package substrate 104/chip package 100.

The inward edge of the dam 110 is outward of the contact pads 204 utilized to connect the signal carrying solder balls 140 of the BGA 148 of the chip package 100 to vias 202 formed in the PCB 102 that are part of the PCB circuitry 112. The solder balls 140 are also coupled to contact pads 206 formed on the bottom surface 138 of the chip package 100 that terminate the circuitry 114 of the package substrate 104.

In one example, the inward edge of the dam 110 is inward of the edge 122 of the package substrate 104. Alternatively, the inward edge of the dam 110 may be aligned with or even slightly outward of the edge 122 of the package substrate 104, as long as the space between the dam 110 and chip package 100 is sufficient to prevent the free flow of edge bond material 128 therethrough.

Referring briefly to a top view of the PCB 102 depicted in FIG. 3, the spacing between the contact pads 204 disposed in the landing region 146 and the dam 110 is illustrated. In FIG. 3, the contact pads 204 are illustrated in a plurality of rows 302 and columns 304 that are ranged in a complimentary pattern to allow the solder balls 140 of the BGA 148 to be mechanically and electrically connected to the contact pads 204 of the PCB 102 when the chip package 100 is mounted to the PCB 102, for example, using a reflow process. Although in FIG. 3 the dam 110 is shown completely surrounding all the rows 302 and columns 304 of the contact pads 204 configured to connect to the BGA 148 of the chip package 100, the dam 110 may alternatively be discontinuous. For example, the dam 110 may be discontinuous and substantially surround the plurality of contact pads 204 disposed the landing region 146, such as if portions of the dam 110 are connected by an imaginary line, all to the contact pads 204 would surrounded by the imaginary line. In another example, the dam 110 may be comprises of multiple portions, with a respective portion disposed only at the corners of the landing region 146, as shown by in phantom as dams 310, such that 4 "L-shaped" dams 310 are disposed on the PCB 102, one dam 310 at each corner of the landing region 146. In such embodiments, the edge bond material 146 would be utilized only in the regions of the electronic device in which one of the dams 310 was present. That is, the edge bond material 146 would be utilized as 4 "L-shaped" regions of edge bond material 146, one region of edge bond material 146 applied in contact with a corresponding one of the dams 310 at each corner of the landing region 146. In one example, no edge bond material 146 would be present between the dams 310. Optionally, edge bond material 146 may be present between the dams 310 such that the edge bond material 146 contiguously circumscribes the rows 302 and columns 304 of the contact pads 204 configured to connect to the BGA 148 of the chip package 100. Other than it's shape, the dam 310 may be constructed identical to the dam 110, as further described below.

Returning to FIG. 2, the dam 110 may be made from one or more dam layers 230. The dam layers 230 are generally fabricated from a dielectric material. The dam layers 230 may be deposited utilizing any suitable technique. In one example, the dam layers 230 are printed on the top surface 124 of the PCB 102, such as by ink jet or screen printing.

The dam 110 has a height 212 that is less than a diameter 214 of the solder ball 140. Thus, when the chip package 100 is mounted to the top surface 124 of the PCB 102, a gap 216 is defined between the bottom surface 138 of the package substrate 104 and the top surface of the dam 110. Although the dam 110 is shown formed on the top surface 124 of the PCB 102, the dam 110 may alternatively be formed the bottom surface 138 of the package substrate 104, such that the gap 216 is formed between the bottom of the dam 110 and the top surface 124 of the PCB 102. In still another alternatively example, the dam 110 may be formed on both the bottom surface 138 of the package substrate 104 and the top surface 124 of the PCB 102, such that the gap 216 is formed between the top of the first dam 110 coupled to the top surface 124 of the PCB 102 and the top of the dam 110 coupled to the bottom of the second dam 110 coupled to the bottom surface 138 of the package substrate 104.

The distance across the gap 216 is generally selected to prevent the edge bond material 128 from wicking or flowing over the dam 110 into the region of the landing region 146 inward of the dam 110 where the signal carrying solder balls 140 reside. The distance across the gap 216 may be selected commensurate with the properties of the edge bond material 128. In the example depicted in FIG. 2, at least 4 dam layers 230 are utilized to provide the height 212 of the dam 110. In another example, 4-10 dam layers 230 are utilized.

As illustrated in FIG. 3, the dam 110 substantially prevents the edge bond material 128 (not shown in FIG. 3) from flowing into the region of the landing region 146 inward of the same and contacting the solder balls 140 coupled to the rows 302 and columns 304 of the contact pads 204 closest to the dam 110. Beneficially, preventing the edge bond material 128 from contacting the solder balls 140 and/or contact pads 204, 206 in the landing region 146 provides robust, reliable and repeatable signal transmission speeds and performance through the signal carrying solder balls 140.

Returning to FIG. 2, the dam 110 may optionally include a conductive trace 234. The conductive trace 234 may be deposited by plating or other suitable technique. In one example, the conductive trace 234 is copper or aluminum. The conductive trace 234 may be deposited directly on the top surface 124 of the PCB 102, with the dam layers 230 disposed on the conductive trace 234. Optionally, a solder mask layer 232 may be disposed between the dam layers 230 and the conductive trace 234.

When the conductive trace 234 is part of the dam 110, the conductive trace 234 may optionally be coupled to ground to provide electrical shielding to the solder balls 140 providing data signal connections between the PCB 102 and the chip package 100. In one example, the conductive trace 234 is coupled to ground by a plurality of ground vias 236 formed in the PCB 102. The vias 236 are coupled to an external ground by the circuitry 112 of the PCB 102.

In one example, the top surface 124 of the PCB 102 may optionally include a solder mask 208 disposed outward of the landing region 146. The solder mask 208 is spaced from the dam 110 to create an edge bond material receiving channel 210 immediately outward of the dam 110 and the edge 122 of the package substrate 104. In one example, the solder mask 208 is at least 3 mm outward from the edge 122 of the package substrate 104. The edge bond material receiving channel 210 is also shown in FIG. 3. The edge bond material receiving channel 210 provides a trough in which the edge bond material 128 may be dispensed and preferentially distributed around the edge 122 of the chip package 100. As the dam 110 provides an obstruction that substantially prevents the edge bond material 128 from flowing out of the trough formed by the channel 210 and into the region of the landing region 146 disposed inward of the dam 110, undesired contact with the solder balls 140 by the the edge bond material 128 is beneficially avoided.

As the dam 110 preferentially prevents the edge bond material 128 from flowing under the chip package 100, the edge bond material 128 builds up on the edge 122 of the package substrate 104 during the bond material dispensing process. For example, the edge bond material 128 may extends a distance 224 up the edge 122 of the package substrate 104. The edge 122 of the package substrate 104 has a height 222 of package substrate 104. The distance 224 may be 50 percent or more of the height 222. In one example, the distance 224 is 50 to 90 percent of the height 222. The high contact area between the edge bond material 128 to the edge 122 of the package substrate 104 provides excellent adhesion. As the edge bond material 128 is also coupled to the top surface 124 of the PCB 102 and the dam 110, the edge bond material 128 securely couples the chip package 100 to the PCB 102. In the example depicted in FIG. 2, the edge bond material 128 is also in contact with the bottom surface 138 of the package substrate 104, which further enhances strength and reliability of the bond between the chip package 100 and the PCB 102.

Thus, an electronic device and methods for fabricating the same are disclosed that utilize a dam to control the flow of edge bond material. The dam substantially prevents the edge bond material from freely flowing between the PCB and chip package and contacting the solder balls utilized to transmit data signals between the PCB and chip package. Since the dam effectively prevents potential interfacing of the edge bond material with the signal transmission solder balls, robust, reliable and repeatable signal transmission speed and performance of the electronic device are realized. Additionally, the lack of edge bond material contacting the solder balls also dramatically improves the uniformity of electronic device to device performance, correspondingly improving product yields and customer satisfaction.

While the foregoing is directed to embodiments of the present invention, other and further embodiments of the invention may be devised without departing from the basic scope thereof, and the scope thereof is determined by the claims that follow.

What is claimed is:

1. An electronic device comprising:
a printed circuit board (PCB) having a first surface, the first surface having a landing region configured to be covered by a chip package when the chip package is mounted to the first surface;
a plurality of contact pads formed on the landing region of the PCB arranged to receive a ball grid array (BGA) formed on the chip package; and
a dam disposed on the first surface of the PCB, at least a portion of the dam disposed within the landing region and substantially surrounding the plurality of contact pads, the dam comprising:
a conductive trace disposed on the first surface of the PCB; and
one or more dielectric layers disposed over the conductive trace.

2. The electronic device of claim 1, wherein the dam has a height less than a diameter of a BGA solder ball.

3. The electronic device of claim 1, wherein the dam further comprises:
four L-shaped corner portions.

4. The electronic device of claim 1, wherein the one or more dielectric layers are printed.

5. The electronic device of claim 1, wherein the dam further comprises:
a solder mask layer disposed between the conductive trace and the one or more dielectric layers.

6. The electronic device of claim 1 further comprising:
a plurality of ground vias formed through the PCB and contacting the conductive trace.

7. The electronic device of claim 1, wherein the solder mask is disposed on the first surface of the PCB and surrounds the dam, wherein a portion of the first surface of the PCB is exposed between the solder mask and the dam.

8. The electronic device of claim 1 further comprising:
a chip package mechanically and electrically connected to the contact pads disposed on the first surface of the PCB, wherein at least a portion of the dam is disposed between the chip package and the PCB; and
edge bond material disposed on the first surface of the PCB, the edge bond material contacting the chip package, the first surface of the PCB and the dam.

9. An electronic device comprising:
a chip package having a ball grid array (BGA);
a printed circuit board (PCB) having a plurality of contact pads formed on a landing region of a first surface of the PCB, the plurality of contact pads mechanically and electrically connected to the BGA of the chip package;
a dam disposed between the PCB and the chip package, the dam disposed outward from a first row of contact pads of the plurality of contact pads, the first row of contact pads coupled to a first row of solder connections of the BGA disposed closest to an edge of the chip package, the dam comprising:
a conductive trace disposed on the first surface of the PCB; and
one or more dielectric layers disposed over the conductive trace; and
edge bond material disposed on the first surface of the PCB, the edge bond material contacting an edge of the chip package, the first surface of the PCB and the dam.

10. The electronic device of claim 9, wherein the dam further comprises:
four "L-shaped" dams, one of which disposed at each corner of the landing region.

11. The electronic device of claim 9, wherein the dam is formed on the first surface of the PCB.

12. The electronic device of claim 9, wherein one or more dielectric layers of the dam further comprises:
a plurality of layers.

13. The electronic device of claim 12, wherein the plurality of layers are printed.

14. The electronic device of claim 9, wherein the dam further comprises:
a solder mask layer disposed between the one or more dielectric layers and the conductive trace.

15. The electronic device of claim 9 further comprising:
a plurality of ground vias formed through the PCB and contacting the conductive trace.

16. The electronic device of claim 9 further comprising:
a solder mask disposed on the first surface of the PCB and outward of the dam and chip package, wherein an exposed portion of the first surface of the PCB is exposed between the solder mask and the dam, wherein the edge bond material contacts the chip package, the exposed portion of the first surface of the PCB and the dam.

17. The electronic device of claim 9, wherein chip package further comprises:
a package substrate and one or more integrated circuit dies disposed on a first side of the package substrate, a second side of the package substrate having the plurality of contact pads formed thereon, the package substrate having an edge connecting the first side to the second side, the edge bond material contacting the first surface of the PCB, 50 to 90 percent of the edge of the package substrate, and the dam.

18. An electronic device comprising:
a chip package;
a printed circuit board (PCB);
a plurality of electrical connections mechanically and electrically coupling the chip package to a first surface of the PCB;

one or more dams disposed between the PCB below the chip package, the one or more dams disposed outward of the electrical connections, the one or more dams spaced from one of the chip package or PCB, at least one of the one or dams comprising:
- a conductive trace disposed on the first surface of the PCB; and
- one or more dielectric layers disposed over the conductive trace; and edge bond material disposed on the first surface of the PCB, the edge bond material contacting an edge of the chip package, the first surface of the PCB and the one or more dams.

19. The electronic device of claim 9, wherein the dam further comprises:
- a plurality of ground vias extending through the PCB and connected to the conductive trace.

* * * * *